(12) United States Patent
Lu et al.

(10) Patent No.: US 9,214,392 B1
(45) Date of Patent: Dec. 15, 2015

(54) METHOD OF FORMING CONTACT HOLE AND SEMICONDUCTOR STRUCTURE WITH CONTACT PLUG

(71) Applicant: UNITED MICROELECTRONICS CORP., Hsin-Chu (TW)

(72) Inventors: Chia-Lin Lu, Taoyuan County (TW); Chun-Lung Chen, Tainan (TW); Kun-Yuan Liao, Hsin-Chu (TW); Feng-Yi Chang, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/527,778

(22) Filed: Oct. 30, 2014

(30) Foreign Application Priority Data

Sep. 30, 2014 (TW) .............................. 103134069 A

(51) Int. Cl.
| | |
|---|---|
| *H01L 21/8234* | (2006.01) |
| *H01L 27/088* | (2006.01) |
| *H01L 21/768* | (2006.01) |
| *H01L 23/535* | (2006.01) |
| *H01L 23/532* | (2006.01) |
| *H01L 21/311* | (2006.01) |

(52) U.S. Cl.
CPC .. *H01L 21/823475* (2013.01); *H01L 21/31111* (2013.01); *H01L 21/76897* (2013.01); *H01L 21/823431* (2013.01); *H01L 21/823437* (2013.01); *H01L 23/535* (2013.01); *H01L 23/53295* (2013.01); *H01L 27/0886* (2013.01)

(58) Field of Classification Search
None
See application file for complete search history.

(56) References Cited

U.S. PATENT DOCUMENTS

| 7,582,567 B1 | 9/2009 | Syau | |
|---|---|---|---|
| 2004/0203210 A1* | 10/2004 | Lee | H01L 21/2652 438/279 |
| 2005/0136649 A1* | 6/2005 | Lee | H01L 21/76897 438/637 |
| 2009/0142895 A1* | 6/2009 | Stephens | H01L 21/76897 438/275 |

* cited by examiner

*Primary Examiner* — Bilkis Jahan
(74) *Attorney, Agent, or Firm* — Winston Hsu; Scott Margo

(57) ABSTRACT

A method of forming a contact hole includes providing a substrate. A nitrogen-containing dielectric layer, a first material layer, a second material layer, an oxygen-containing dielectric layer and a patterned photoresist layer cover the substrate from bottom to top. Then, the oxygen-containing dielectric layer is etched by taking the second material layer as a first etching stop layer to form a patterned oxygen-containing dielectric layer. Latter, the second material layer is etched by taking the first material layer as a second etching stop layer to form a patterned second material layer. Subsequently, the first material layer is etched by taking the nitrogen-containing dielectric layer as a third etching stop layer to form a patterned first material layer. Finally, the nitrogen-containing dielectric layer is etched until the substrate is exposed.

13 Claims, 4 Drawing Sheets

METHOD OF FORMING CONTACT HOLE AND SEMICONDUCTOR STRUCTURE WITH CONTACT PLUG

BACKGROUND OF THE INVENTION

1. Field of the Invention

The present invention relates to a method of forming a contact hole and a method of forming a semiconductor structure with contact plug, wherein more particularly, the contact hole and the semiconductor structure can be formed by a self-aligned contact (SAC) technology.

2. Description of the Prior Art

Semiconductor devices have been rapidly developed due to the wide use of information processing devices such as computers, and are typically required to have a large storage capacity and a high operation speed. To meet these requirements, semiconductor technology has been developed so that semiconductor devices have a high integration density, good reliability, and a high response speed.

As semiconductor devices become more highly integrated, the width of interconnections and spacing between interconnections have also been reduced. Self-aligned contact technology has been used to increase alignment margins when using a photolithography technique to form contact holes in predetermined regions between the interconnections. However, by using the conventional self-aligned contact technology, the cap layer and the spacer of a transistor will be over etched, therefore, current leakage may occurred.

SUMMARY OF THE INVENTION

Accordingly, there exists a need in the art to overcome the above-mentioned problems.

According to a first embodiment of the present invention, a method of forming a contact hole is provided. The steps of the method include providing a substrate. A nitrogen-containing dielectric layer, a first material layer, a second material layer, an oxygen-containing dielectric layer and a patterned photoresist layer cover the substrate from bottom to top, wherein the patterned photoresist layer comprises a contact hole pattern. Later a contact hole is formed by the following steps by taking the patterned photoresist layer as a mask, wherein the steps comprise: firstly, etching the oxygen-containing dielectric layer by taking the second material layer as a first etching stop layer to form a patterned oxygen-containing dielectric layer. Latter, the second material layer is etched by taking the first material layer as a second etching stop layer to form a patterned second material layer. Subsequently, the first material layer is etched by taking the nitrogen-containing dielectric layer as a third etching stop layer to form a patterned first material layer. Finally, the nitrogen-containing dielectric layer is etched until the substrate is exposed.

According to a second embodiment of the present invention, a semiconductor structure with a contact plug comprises a substrate, two gate structures disposed on the substrate, a patterned nitrogen-containing dielectric layer, a patterned first material layer and a patterned second material layer disposed from bottom to top and covering the substrate and each of the gate structures partly and a contact plug disposed between the gate structures. The etching selectivity of the patterned second material layer to the patterned first material layer is greater than 7:1.

These and other objectives of the present invention will no doubt become obvious to those of ordinary skill in the art after reading the following detailed description of the preferred embodiment that is illustrated in the various figures and drawings.

DETAILED DESCRIPTION

Figure 7:
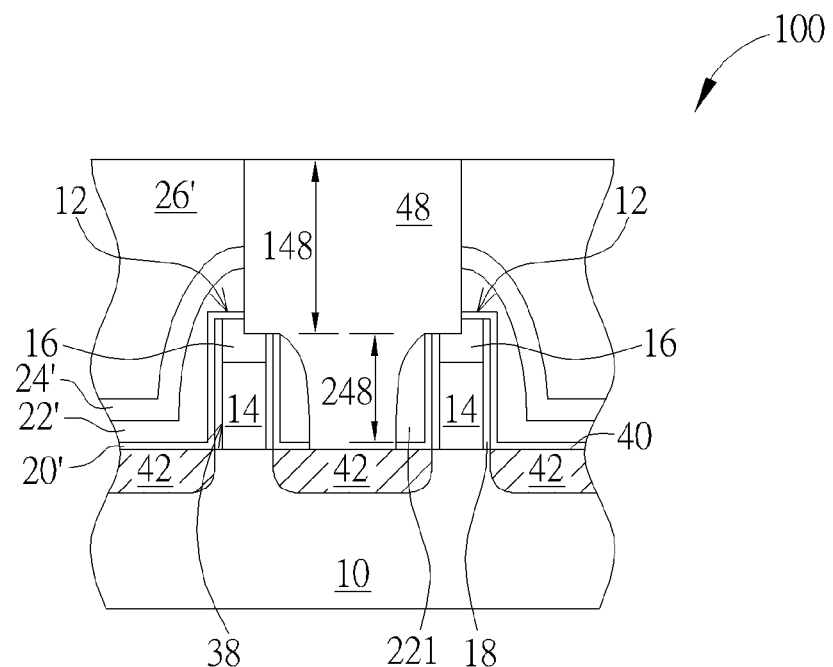
FIG. 7 depicts a semiconductor structure with a contact plug according to a preferred embodiment of the present invention.
Figure 8:
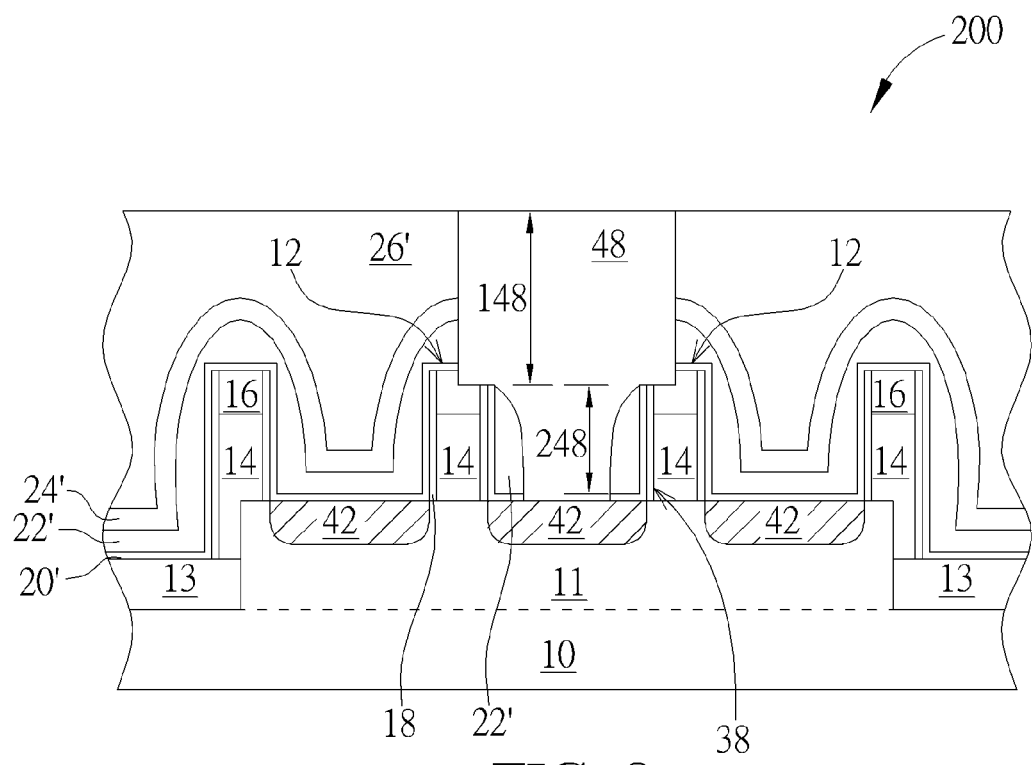
FIG. 8 depicts a semiconductor structure with a contact plug according to another preferred embodiment of the present invention.

FIG. 1 to FIG. 6 schematically depict a method of forming a contact hole according to a preferred embodiment of present invention. FIG. 7 depicts a semiconductor structure with a contact plug according to a preferred embodiment of the present invention. FIG. 8 depicts a semiconductor structure with a contact plug according to another preferred embodiment of the present invention.

Figure 1:
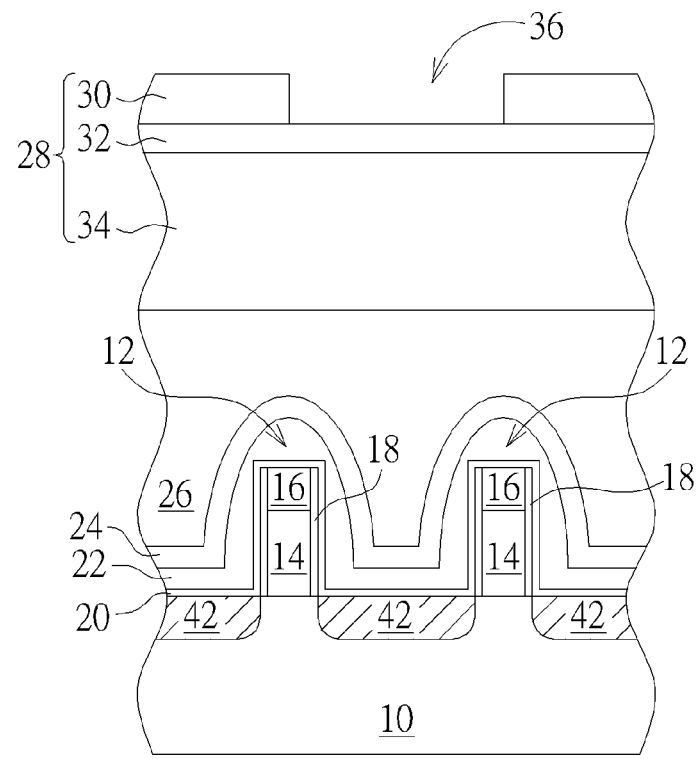
FIG. 1 to FIG. 6 schematically depict a method of forming a contact hole according to a preferred embodiment of present invention.

As shown in FIG. 1, a substrate 10 is provided. The substrate 10 may be a bulk silicon substrate, a germanium substrate, a gallium arsenide substrate, a silicon germanium substrate, an indium phosphide substrate, a gallium nitride substrate, a silicon carbide substrate, or a silicon on insulator (SOI) substrate. The substrate 10 may further comprise a fin structure. Later, at least two gate structures 12 are formed on the substrate 10. Each gate structure 12 includes a gate electrode 14, a cap layer 16 disposed on the gate electrode 14 and a spacer 18 disposed at two sides of the gate electrode 14. Though omitted from the drawing for the sake of simplicity, a gate dielectric layer may be formed between the gate electrode 14 and the substrate 10 by any suitable process to any suitable thickness. The gate electrode 14 may be made of polysilicon, metal or other conductive materials. In addition, the cap layer 16 and the spacer 18 are both insulating materials. The cap layer 16 and the spacer 18 may be independently selected from a group consisting of silicon oxide, silicon nitride, silicon oxynitride or other insulating materials. According to a preferred embodiment of the present invention, the cap layer 16 is silicon nitride and the spacer 18 is also silicon nitride. Then, a source/drain doping region 42 is formed in the substrate 10. Subsequently, a silicide layer (not shown) can be optionally formed on the source/drain doping region 42. After that, a nitrogen-containing dielectric layer 20, a first material layer 22 and a second material layer 24 are formed in sequence and conformally cover the substrate 10 and the gate structure 12. Then, an oxygen-containing dielectric layer 26 and a patterned photoresist layer 28 are formed sequentially to cover the second material layer 24.

According to a preferred embodiment of the present invention, the nitrogen-containing dielectric layer 20 may be silicon nitride, silicon carbon nitride or silicon oxynitride. The thickness of the nitrogen-containing dielectric layer 20 may be 30 to 50 Angstroms. The nitrogen-containing dielectric layer 20 contacts the substrate 10. The first material layer 22 may be low-K material or silicon oxide, such as undoped silicon glass, boron phosphorous silicon glass, or phosphorous silicon glass. The thickness of the first material layer 22 may be 50 to 200 Angstroms. The second material layer 24 may be silicon nitride, silicon carbon nitride or silicon oxynitride. The thickness of the second material layer 24 may be 50 to 200 Angstroms. Furthermore, the oxygen-containing dielectric layer 26 includes low-K material or silicon oxide, such as undoped silicon glass, boron phosphorous silicon glass, phosphorous silicon glass, undoped silicon glass made by a high density plasma deposition process, boron phosphorous silicon glass made by a high density plasma deposition process, or phosphorous silicon glass made by a high density plasma deposition process. Besides, the oxygen-containing dielectric layer 26 may have multiple layers which are made from the materials mentioned above for the oxygen-containing dielectric layer 26. Moreover, the nitrogen-containing dielectric layer 20 preferably utilizes the same material as the second material layer 24 does. The patterned photoresist layer 28 can include multiple layers, for example, a patterned first photoresist layer 30, a second photoresist layer 32, and a third photoresist layer 34. The first patterned photoresist layer 30 includes a contact hole pattern 36.

Figure 2:
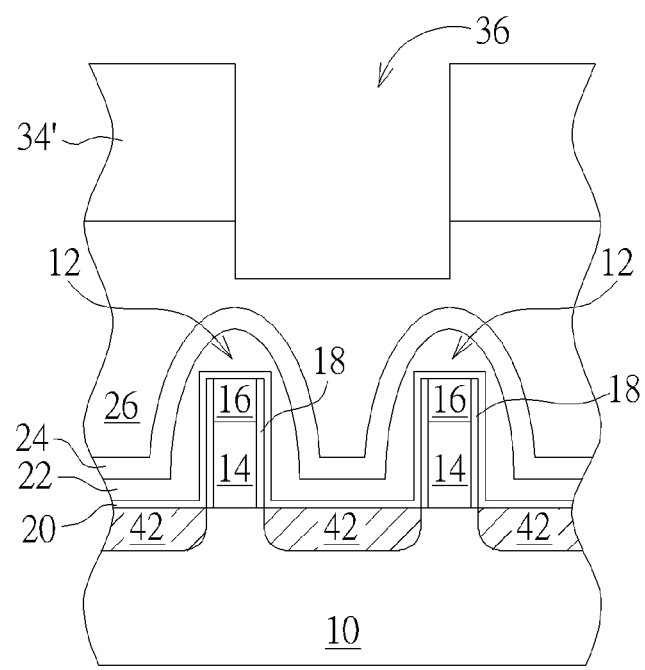

As shown in FIG. 2, the contact hole pattern 36 on the first patterned photoresist layer 30 is transferred to a patterned second photoresist layer (not shown) by an etching process. After that, the patterned first photoresist layer 30 is removed and the patterned second photoresist layer remains. Then, the pattern on the patterned second photoresist layer is transferred to the third photoresist layer 34 to form a patterned third photoresist layer 34'. Later, the patterned second photoresist layer is removed. In addition, after the third photoresist layer 34 is etched to open up by the etch process, part of the oxygen-containing dielectric layer 26 under the third photoresist layer 34 is optionally etched. According to a preferred embodiment of the present invention, the first photoresist layer 30 may be 193 nm photoresist. The second photoresist layer 32 may be silicon-containing hard mask bottom anti-reflective coating (SHB). The third photoresist layer 34 may be organic dielectric layer (ODL) or I-line (365 nm) photoresist.

Figure 3:
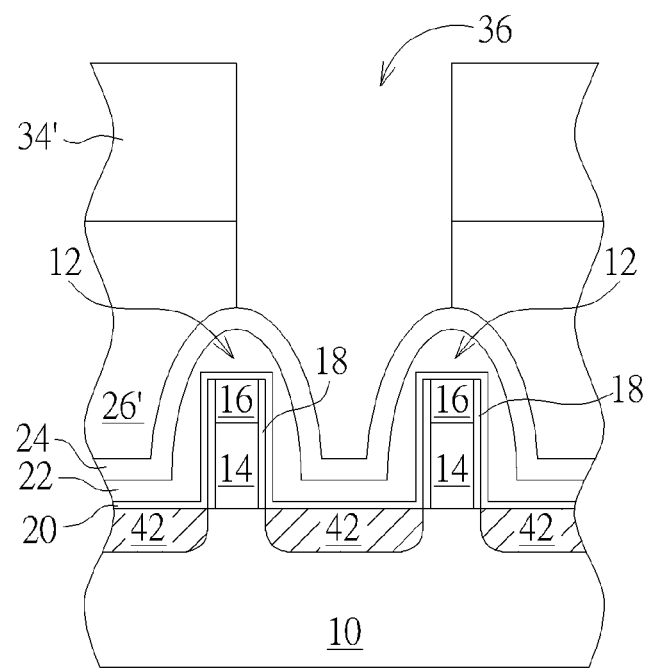

Now the method of making a contact hole of the present invention is implemented. In the following steps, dry etches are used, but are not limited to it. Based on different requirements, wet etches may also be used. As shown in FIG. 3, during a first etch process, the oxygen-containing dielectric layer 26 is etched to form a patterned oxygen-containing dielectric layer 26' by taking the patterned third photoresist layer 34' as a mask and taking the second material layer 24 as a first etch stop layer. The etching selectivity of the oxygen-containing dielectric layer 26 to the second material layer 24 is greater than 7:1, preferably greater than 8:1 when taking perfluoroalkyl compounds as a primary etchant. The etchant and carrier gas used in the first etch process advantageously includes $C_4F_6$, $C_4F_8$, $CO_2$, $O_2$, CO or Ar. Etching Selectivity is a ratio of the etch rates between the different materials.

Figure 4:
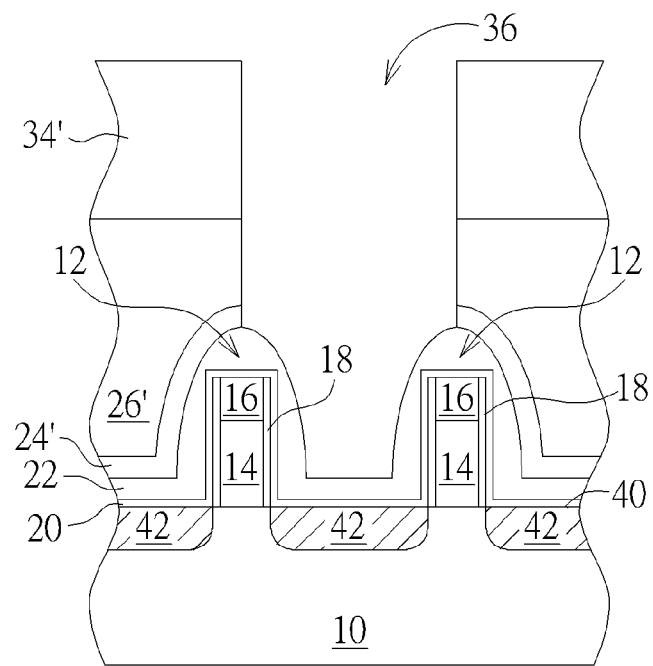

As shown in FIG. 4, during a second etch process, the second material layer 24 is etched to form a patterned second material layer 24' by taking the patterned third photoresist layer 34' and the patterned oxygen-containing dielectric 26' as a mask and taking the first material layer 22 as a second etch stop layer. In other words, the second material layer 24 uncovered by the patterned third photoresist layer 34' is etched continuously until the first material layer 22 under the second material layer 24 is exposed. The etching selectivity of the second material layer 24 to the first material layer 22 is greater than 7:1, preferably greater than 10:1 when taking fluoroalkyl compounds as a primary etchant. The etchant and carrier gas used in the second etch process advantageously includes $CH_2F_2$, $CH_3F$, $CO_2$ or Ar.

Figure 5:
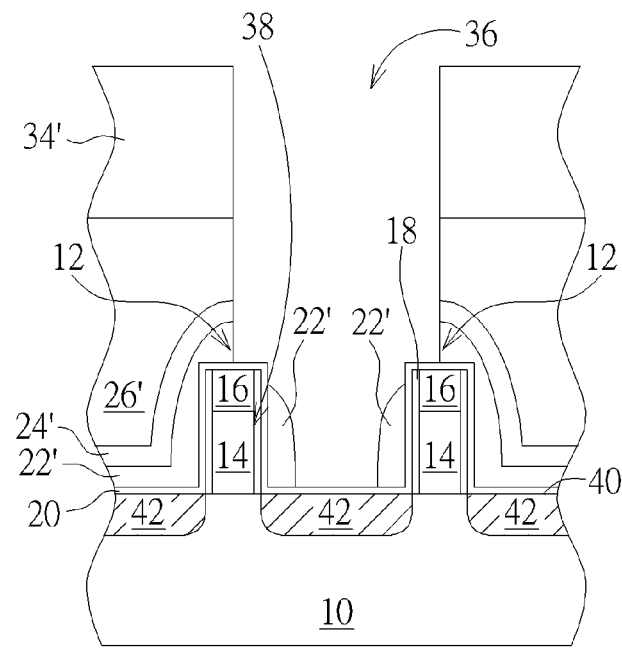

As shown in FIG. 5, during a third etch process, the first material layer 22 is etched to form a patterned first material layer 22' by taking the patterned third photoresist layer 34', the patterned oxygen-containing dielectric 26' and patterned second material layer 24' as a mask and taking the nitrogen-containing dielectric layer 20 as a third etch stop layer. In other words, the first material layer 22 uncovered by the patterned third photoresist layer 34' is etched continuously until the nitrogen-containing dielectric layer 20 under the first material layer 22 is exposed. The etching selectivity of the first material layer 22 to the nitrogen-containing dielectric layer 20 is greater than 7:1, preferably greater than 8:1 when taking perfluoroalkyl compounds as a primary etchant. The etchant and carrier gas used in the third etch process advantageously includes $C_4F_6$, $C_4F_8$, $CO_2$, $O_2$, CO or Ar. It is noteworthy that a dry etch is used in the third etch process. The dry etch is anisotropical therefore the etch rate in the vertical direction is faster than that in the horizontal direction. In this way, only part of the first material layer 22 uncovered by the patterned photoresist layer 34' is removed. The remaining patterned first material layer 22' is on a sidewall 38 of the gate structure 12. The sidewall 38 is perpendicular to a surface 40 of the substrate 10.

Figure 6:
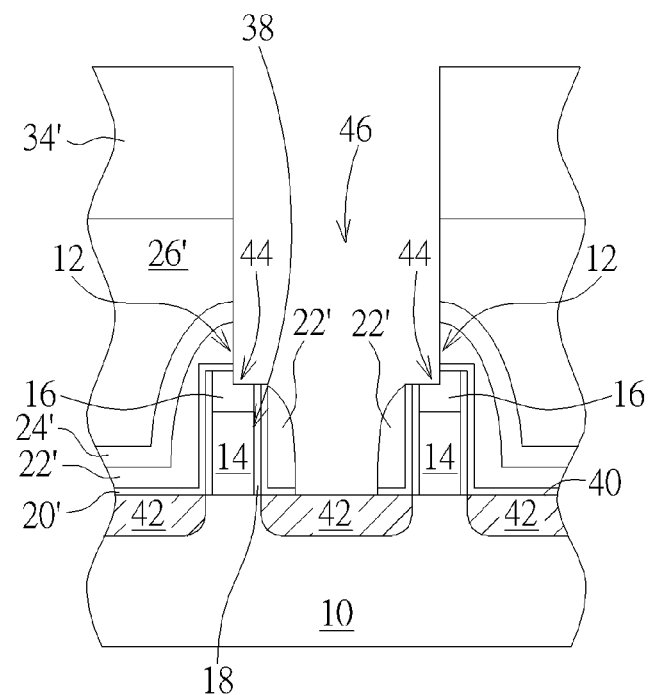

As shown in FIG. 6, during a fourth etch process, the nitrogen-containing dielectric layer 20 is etched until the surface 40 of the substrate 10 between the gate structures 12 is exposed by taking the patterned third photoresist layer 34', the patterned oxygen-containing dielectric 26', the patterned second material layer 24', and the patterned first material layer 22' as a mask and taking the gate structures 12 and substrate 10 as an etch stop layer. After the fourth etch process, the nitrogen-containing dielectric layer 20 is etched to form a patterned nitrogen-containing dielectric layer 20'. The exposed substrate 10 includes the source/drain doping region 42. During the fourth etch process, perfluoroalkyl compounds or fluoroalkyl compounds are used as primary etchant. The etchant and carrier gas used in the fourth etch process advantageously includes $CH_2F_2$, $CH_3F$, $O_2$ or Ar. According to another preferred embodiment of the present invention, the etchant and carrier gas used in the fourth etch process advantageously includes $C_4F_6$, $C_4F_8$, $CO_2$, $O_2$, CO or Ar. At this point, the contact hole 46 of the present invention is completed. Please still refer to FIG. 6, at least part of the contact hole 46 overlaps the source/drain doping region 42. The patterned first material layer 22' remains on the sidewall 38 of the gate structure 12 defines the contact hole 46. It is noteworthy that when removing the nitrogen-containing dielectric layer 20 to expose the substrate 10, part of the cap layer 16 and the spacer 18 are etched therefore a break 44 is formed on the gate structures 12. Because the first material layer 22 and the second material layer 24 are introduced in the present invention, the cap layer 16 and the spacer 18 with break 44 thereon can still provide enough protection to the gate electrode 14, and contact between a contact plug forming afterwards and the gate electrode 14 can be prevented.

As shown in FIG. 7, the patterned photoresist layer 34' is removed, and a contact plug 48 is formed in the contact hole 46 to contact the source/drain doping region 42. Moreover, before the contact plug 48 is formed, a silicide layer (not shown) can be optionally formed on the source/drain doping region 42. At this point, a semiconductor structure with a contact plug 100 of the present invention is completed.

The method of forming contact hole provided in the present invention can be used to form contact hole on a fin structure. Please refer to FIG. 1 to FIG. 7 for detailed fabricating process; the detail fabricating description is omitted here. As shown in FIG. 8, a semiconductor structure with contact plug 200 can be completed by using the method provided in FIG. 1 to FIG. 7, wherein like reference numerals are used to refer to like elements throughout. Refer to FIG. 8. A fin structure 11 is formed on the substrate 10. At least two gate structures are disposed on the fin structure 11. In addition, STIs 13 are disposed at two sides of the fin structure 11.

A semiconductor structure with a contact plug 100 is provided in the present invention. As shown in FIG. 7, the semiconductor structure with a contact plug 100 includes a substrate 10 and at least two gate structures 12 disposed on the substrate 10. A patterned nitrogen-containing dielectric layer 20', a patterned first material layer 22' and a patterned second material layer 24' are arranged from bottom to top and cover part of the gate structure 12 and the substrate 10. The etching selectivity of the patterned second material layer 24' to the patterned first material layer 22' is greater than 7:1, preferably greater that 10:1 when taking fluoroalkyl compounds as a primary etchant. In addition, a contact plug 48 is disposed between the gate structures 12. The etching selectivity of the patterned first material layer 22' to the patterned nitrogen-containing dielectric layer 20' is greater than 7:1 and preferably greater than 8:1 when taking perfluoroalkyl compounds as a primary etchant. The etching selectivity of the patterned oxygen-containing dielectric layer 26' to the patterned second material layer 24' is greater than 7:1, preferably greater than 8:1 when taking perfluoroalkyl compounds as a primary etchant. Furthermore, each gate structure 12 includes a gate electrode 14, a cap layer 16 is disposed on the gate electrode 14 and a spacer 18 is disposed at two sides of the gate electrode 14. The gate electrode 14 may be made of polysilicon, metal or other conductive materials. In addition, the cap layer 16 and the spacer 18 are both insulating materials. The cap layer 16 and the spacer 18 may independently select from a group consist of silicon oxide, silicon nitride, silicon oxynitride or other insulating materials. The patterned nitrogen-containing dielectric layer 20' may be silicon nitride, silicon carbon nitride or silicon oxynitride. The patterned nitrogen-containing dielectric layer 20' contact the substrate 10. The patterned first material layer 22' may be low-K material or silicon oxide, such as undoped silicon glass, boron phosphorous silicon glass, or phosphorous silicon glass. The patterned second material layer 24' may be silicon nitride, silicon carbon nitride or silicon oxynitride. Moreover, the patterned oxygen-containing dielectric layer 26' includes low-K material or silicon oxide, such as undoped silicon glass, boron phosphorous silicon glass, phosphorous silicon glass, undoped silicon glass made by a high density plasma deposition process, boron phosphorous silicon glass made by a high density plasma deposition process, or phosphorous silicon glass made by a high density plasma deposition process. Besides, the patterned oxygen-containing dielectric layer 26' may have multiple layers which are made from the materials mentioned above for the patterned oxygen-containing dielectric layer 26'. Moreover, the patterned nitrogen-containing dielectric layer 20' preferably utilizes the same material as the patterned second material layer 24' does. The patterned first material layer 22' is disposed on a sidewall 38 of the gate structure 12. The sidewall 38 is perpendicular to a surface 40 of the substrate 10.

The substrate 10 may include a source/drain doping region 42. A contact plug 48 contacts the source/drain doping region 42. Specifically speaking, the contact plug 48 is a T-shaped structure. The T-shaped structure includes an upper part 148 and a lower part 248. A width of the upper part 148 is greater than that of the lower part. The lower part 248 of the contact plug 48 contacts both the patterned first material layer 22' and the substrate 10.

Please refer to FIG. 8. According to another preferred embodiment of the present invention, the substrate 10 may optionally include a fin structure 11. The gate structure 12 and the contact plug 48 may disposed on the fin structure 11. Other elements in FIG. 8 are similar to that in FIG. 7, and therefore are omitted here.

The present invention introduces the first material layer and the second material layer and uses the etch selectivity between the first material layer, the second material layer and the nitrogen-containing dielectric layer to form a self-aligned contact hole. Please refer to FIG. 6, according to the method provided in the present invention, after the contact hole 46 is formed, the cap layer 16 and the spacer 18 on the gate electrode 14 will merely lose a little area, and a break 44 is formed. Although the break 44 happens, the gate electrode 14 is still covered by cap layer 16 and the spacer 18. Therefore, the contact plug 48 can be entirely insulated from the gate electrode.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a contact hole, comprising:
   providing a substrate, a nitrogen-containing dielectric layer, a first material layer, a second material layer, an oxygen-containing dielectric layer and a patterned photoresist layer arranged from bottom to top and covering the substrate, wherein the patterned photoresist layer comprises a contact hole pattern;
   forming a contact hole by the following steps by taking the patterned photoresist layer as a mask, wherein the steps comprise:
      etching the oxygen-containing dielectric layer by taking the second material layer as a first etching stop layer to form a patterned oxygen-containing dielectric layer;
      etching the second material layer by taking the first material layer as a second etching stop layer to form a patterned second material layer;
      etching the first material layer by taking the nitrogen-containing dielectric layer as a third etching stop layer to form a patterned first material layer; and
      etching the nitrogen-containing dielectric layer until exposing the substrate.

2. The method of forming a contact hole of claim 1, wherein the second material layer comprises silicon nitride, silicon carbon nitride or silicon oxynitride.

3. The method of forming a contact hole of claim 1, wherein the first material layer comprises silicon oxide.

4. The method of forming a contact hole of claim 1, wherein the second material layer utilizes the same material as the nitrogen-containing dielectric layer does.

5. The method of forming a contact hole of claim 1, wherein the etching selectivity of the second material layer to the first material layer is greater than 7:1 when taking fluoroalkyl compounds as a primary etchant.

6. The method of forming a contact hole of claim 1, wherein the etching selectivity of the first material layer to the nitrogen-containing dielectric layer is greater than 8:1 when taking perfluoroalkyl compounds as a primary etchant.

7. The method of forming a contact hole of claim 1, wherein the etching selectivity of the second material layer to the first material layer is greater than 10:1 when taking fluoroalkyl compounds as a primary etchant.

8. The method of forming a contact hole of claim 1, wherein an etchant used to etch the second material layer comprises fluoroalkyl compounds.

9. The method of forming a contact hole of claim 1, further comprising:

forming at least two gate structures on the substrate, wherein the nitrogen-containing dielectric layer, the first material layer, the second material layer, the oxygen-containing dielectric layer and the patterned photoresist layer cover the gate structures; and forming a source/drain doping region in the substrate and between the two gate structures.

10. The method of forming a contact hole of claim 9, wherein the contact hole at least overlaps part of the source/drain doping region.

11. The method of forming a contact hole of claim 9, wherein the substrate comprises a fin structure, and the gate structures are disposed on the fin structure.

12. The method of forming a contact hole of claim 9, wherein each of the gate structure comprises a gate electrode, a cap layer disposed on the gate electrode, and a spacer disposed on a sidewall of the gate electrode, and wherein when the nitrogen-containing layer is etched, part of the cap layer and the spacer are also etched.

13. The method of forming a contact hole of claim 9, wherein after the substrate is exposed, part of the patterned first material layer remains at a sidewall of the gate structures, the sidewall is perpendicular to a surface of the substrate, and the remaining patterned first material layer defines the contact hole.

* * * * *